United States Patent [19]

Talwar

[11] Patent Number: 5,148,117
[45] Date of Patent: Sep. 15, 1992

[54] ADAPTIVE FEED-FORWARD METHOD AND APPARATUS FOR AMPLIFIER NOISE REDUCTION

[75] Inventor: Ashok K. Talwar, Westlake Village, Calif.

[73] Assignee: American Nucleonics Corporation, Westlake Village, Calif.

[21] Appl. No.: 797,788

[22] Filed: Nov. 25, 1991

[51] Int. Cl.$^5$ ............................................. H03F 1/32
[52] U.S. Cl. ...................................... 330/151; 330/149
[58] Field of Search ............... 328/162, 163; 330/107, 330/149, 151

[56] References Cited

U.S. PATENT DOCUMENTS

| | | | |
|---|---|---|---|
| 3,699,444 | 10/1972 | Ghose | 343/180 X |
| 4,389,618 | 6/1983 | Baumann | 330/149 |
| 5,077,532 | 12/1991 | Obermann et al. | 330/151 |

OTHER PUBLICATIONS

*An HF Dynamic Range Amplifier Using Feedforward Techniques,* published in RF Design Magazine, Jul. 1987, pp. 50–59, authored by Jean Yamas.

*Antenna Spacing Considerations In An Interference Canceller,* by Ashok K. Talwar, published in IEEE Transactions On Broadcasting, vol. 36, No. 3, pp. 203–206, Sep. 1990.

*Collocation Of Receivers And High-Power Broadcast Transmitters,* by Rabindra Ghose, published in IEEE Transactions On Broadcasting, vol. 34, No. 2, Jun. 1988.

*Primary Examiner*—Steven Mottola
*Attorney, Agent, or Firm*—Hoffmann & Baron

[57] ABSTRACT

An adaptive feed-forward cancelling system obtains a reference signal and a sample signal from an amplifier by directional couplers. The sample signal essentially consists of an undistorted input signal component and a noise and distortion component. The reference and sample signals are provided to an adaptive interference canceller which performs an adaptive cancellation process. The interference canceller provides a cancellation signal essentially consisting of the signal component which is common to both the reference signal and the sample signal. The cancellation signal is injected into a transmission line which carries the sample signal so that only an error signal remains which essentially consists of the noise distortion component of the amplifier output signal. The error signal is then amplitude and phase adjusted to have substantially the same amplitude and to be substantially 180° out of phase with the amplifier output signal. The amplitude and phase adjustment error signal is then injected by a directional coupler onto the transmission line which carries the amplifier output signal so that an amplified input signal is provided by the power amplifier without the noise and distortion components added by the amplifier.

8 Claims, 2 Drawing Sheets

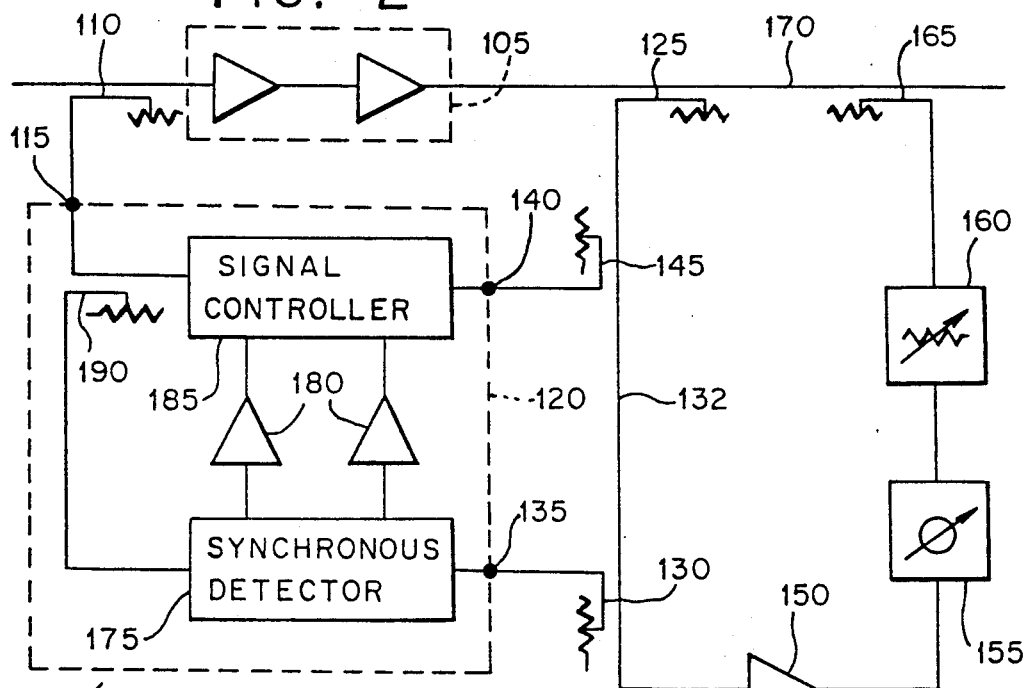
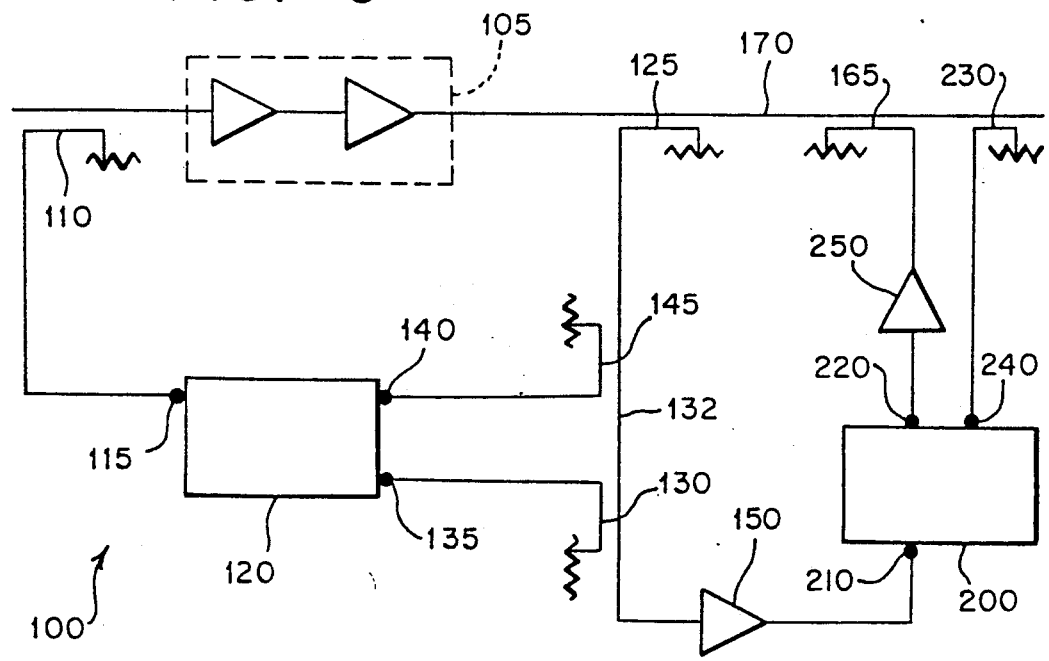

ADAPTIVE FEED-FORWARD METHOD AND APPARATUS FOR AMPLIFIER NOISE REDUCTION

BACKGROUND OF THE INVENTION

1. Field of the Invention

This invention relates generally to distortion cancellation techniques and more specifically to feed-forward networks and techniques for altering the amount of signal noise and distortion provided by amplifying devices.

2. Description of the Prior Art

Amplifiers are customarily used for enhancing electrical signals. However, a common problem associated with such signal enhancement is the addition of amplifier noise and distortion to the electrical signal. This is especially true when power amplifiers are utilized. Traditionally, feed-forward networks and techniques have been used to reduce the amount of signal noise and distortion generated by such amplifying devices.

FIG. 1 is a functional diagram of a traditional feed-forward system 1 coupled to an amplifier 5 which generates noise and distortion when amplifying an input signal. More specifically, the amplifier 5 has an input port at 10 on which is provided an undistorted input signal and an output port at 15. The feed-forward network includes a directional coupler 20 which is operatively connected to the amplifier input port in order to provide an undistorted input signal. A directional coupler 25 is operatively connected to the amplifier output port in order to provide a sample output signal of the amplifier. The sample output signal contains an input signal component, whose amplitude is altered by the amplifier, as well as an unwanted noise and distortion component added to the amplified input signal by the amplifier.

The conventional feed-forward network shown in FIG. 1 includes a manually adjustable phase adjustment means 30 and a manually adjustable amplitude adjustment means 35. The phase and amplitude adjustment means are connected in series with each other and they are coupled to the output of the directional coupler 25. The amplitude of the sample output signal is adjusted by the amplitude adjustment means 35 such that the input signal component of the sample output signal has the same amplitude as the input signal. The phase adjustment means 30 alters the phase of the sample output signal so that the sample output signal is 180° out of phase with the input signal.

The phase and amplitude adjusted sample output signal and the undistorted input signal are provided to a coupling device 40 in order to remove or cancel the input signal component from the amplitude and phase adjusted sample output signal. After the signals are combined, the coupling device will provide a signal which essentially consists of only the noise and distortion components added to the input signal during amplification by the amplifier 5.

The output signal from coupling device 40 is provided to an error amplifier 45 which can amplify the coupling device output signal to substantially match the amplitude of the noise and distortion component of the amplifier output signal. The coupling device output signal is then further adjusted in amplitude and phase by fine amplitude and phase adjustment means 50, 55 so that the signal has substantially the same amplitude and is substantially 180° out of phase with the undesirable noise and distortion component of the amplifier output signal. The amplitude and phase adjusted error amplifier output signal is then combined by means of directional coupler 60 with the amplifier output signal. As a result of the amplitude and phase adjusted error amplifier output signal being equal in amplitude and 180° out of phase with the amplifier output signal, the unwanted noise and distortion that was added by the amplifier is canceled from the amplifier output signal. The remaining output signal is free of noise and distortion and it corresponds to an amplified, undistorted input signal.

In the conventional feed-forward system of FIG. 1, the amplitude and phase manipulation of the signals is typically produced by components that are manually adjusted. This usually results in poor noise and distortion cancellation performance as the characteristics of the input signal vary. Environmental effects and aging may affect component values and require that the selected phase and amplitude settings be changed. Since the noise and distortion components may not be completely eliminated from the amplifier's output signal because of improper manual settings, the performance of the system can be significantly degraded. As the input signal parameters such as signal frequency or amplitude change, tedious readjustments of the components are often required. Furthermore, the gain or phase of the amplifier may change when the frequency or amplitude of the input signal changes requiring additional adjustments of the system components.

OBJECTS AND SUMMARY OF THE INVENTION

It is an object of the present invention to provide a method and apparatus for reducing the amount of signal noise and signal distortion in amplifier output signals.

It is another object of the present invention to provide a feed-forward network which avoids the need for manual adjustments of components by automatically monitoring the input signal.

It is yet another object of the present invention to provide a feed-forward network which utilizes an adaptive interference canceller.

It is a further object of the present invention to provide an adaptive interference canceller in a feed-forward technique for amplifier noise reduction to correct for changes in component operation caused by the environment and aging of system components.

It is yet a further object of the present invention to provide an adaptive feed-forward method and apparatus for amplifier noise reduction which overcomes the inherent disadvantages of known feed-forward methods and apparatus.

In accordance with one form of the present invention, an adaptive feed-forward apparatus for amplifier noise reduction includes a first directional coupler. The first directional coupler is electrically coupled to an amplifier input and receives an input signal. The first directional coupler provides a sample of the input signal, which is essentially free of noise and distortion, as a reference signal to a reference input of an interference canceller. Electrically coupled to the amplifier output is a second directional coupler for providing a sample of the amplifier output signal, which signal contains an amplified input signal component and a noise and distortion component which has been added by the amplifier. The sample signal is provided to a sample input of the interference canceller through a third directional coupler.

The interference canceller essentially detects the signal components of the sample signal that are coherent with the reference signal. The canceller operates by comparing the reference signal and the sample signal to determine which components are common to both signals. Thereafter, a cancellation signal is provided on the output of the canceller. The cancellation signal is injected by a fourth directional coupler back into the transmission line which carries the sample signal in order to eliminate the coherent signal component from the sample signal. Upon injection, the cancellation signal has substantially the same amplitude as the amplified input signal component of the sample signal but it is substantially 180° out of phase with the coherent signal. What is left on the transmission line is an error signal essentially consisting of the noise and distortion components added to the input signal by the amplifier.

A linear, low noise error amplifier may be used to amplify the error signal so that upon injection by a fifth directional coupler, it has substantially the same magnitude as the noise and distortion component of the amplifier output signal. The apparatus may further include serially connected phase and amplitude trimmers which are electrically coupled to the output of the error amplifier. The phase and amplitude trimmers are utilized for adjusting the error signal to insure that after injection by the fifth directional coupler, the error signal has substantially the same amplitude and is substantially 180° out of phase with the noise and distortion components of the amplifier output signal. The phase and amplitude trimmers are included to compensate for any variation, especially losses caused by the coupler, in amplitude and phase of the error signal.

Operatively coupled to the series arrangement of the phase and amplitude trimmers is the fifth directional coupler. The fifth directional coupler is also electrically coupled to the transmission line which carries the amplifier output signal. The fifth directional coupler is used to inject the phase and amplitude adjusted error signal onto the transmission line which carries the amplifier output signal so as to cancel the noise and distortion component added by the amplifier during amplification. In this way, the output signal only consists of the input signal amplified by the amplifier and it is essentially free of the additional unwanted noise and distortion component.

In an alternative embodiment, a second interference canceller may be used in place of the phase and amplitude trimmers. The reference input of the second interference canceller is coupled to the output of the linear, low noise error amplifier while the sample input of the second interference canceller is coupled through a sixth directional coupler to the amplifier output. The output port of the second interference canceller may be coupled to a second linear, low noise error amplifier for amplification of the second cancellation signal. The second linear, low noise error amplifier may be coupled to the output of the amplifier by means of the fifth directional coupler. The fifth directional coupler is used to inject the second cancellation signal onto the transmission line carrying the amplifier output signal so as to cancel the noise and distortion component added by the amplifier during amplification. In this way, the amplifier output signal is twice compared with the input signal so as to insure that the output signal only consists of the amplified input signal and is essentially free of the additional unwanted noise and distortion component generated by the amplifier.

A preferred form of the adaptive feed-forward apparatus for amplifier noise reduction as well as other embodiments, objects, features and advantages of this invention will be apparent from the following detailed description of illustrative embodiments thereof, which is to be read in connection with the accompanying drawings.

BRIEF DESCRIPTION OF THE DRAWINGS

FIG. 2 is a functional block diagram of one form of an adaptive feed-forward apparatus for amplifier noise reduction formed in accordance with the present invention.

FIG. 3 is a functional block diagram of an alternative form of the adaptive feed-forward apparatus of the present invention.

DETAILED DESCRIPTION OF THE PREFERRED EMBODIMENT

Figure 1:
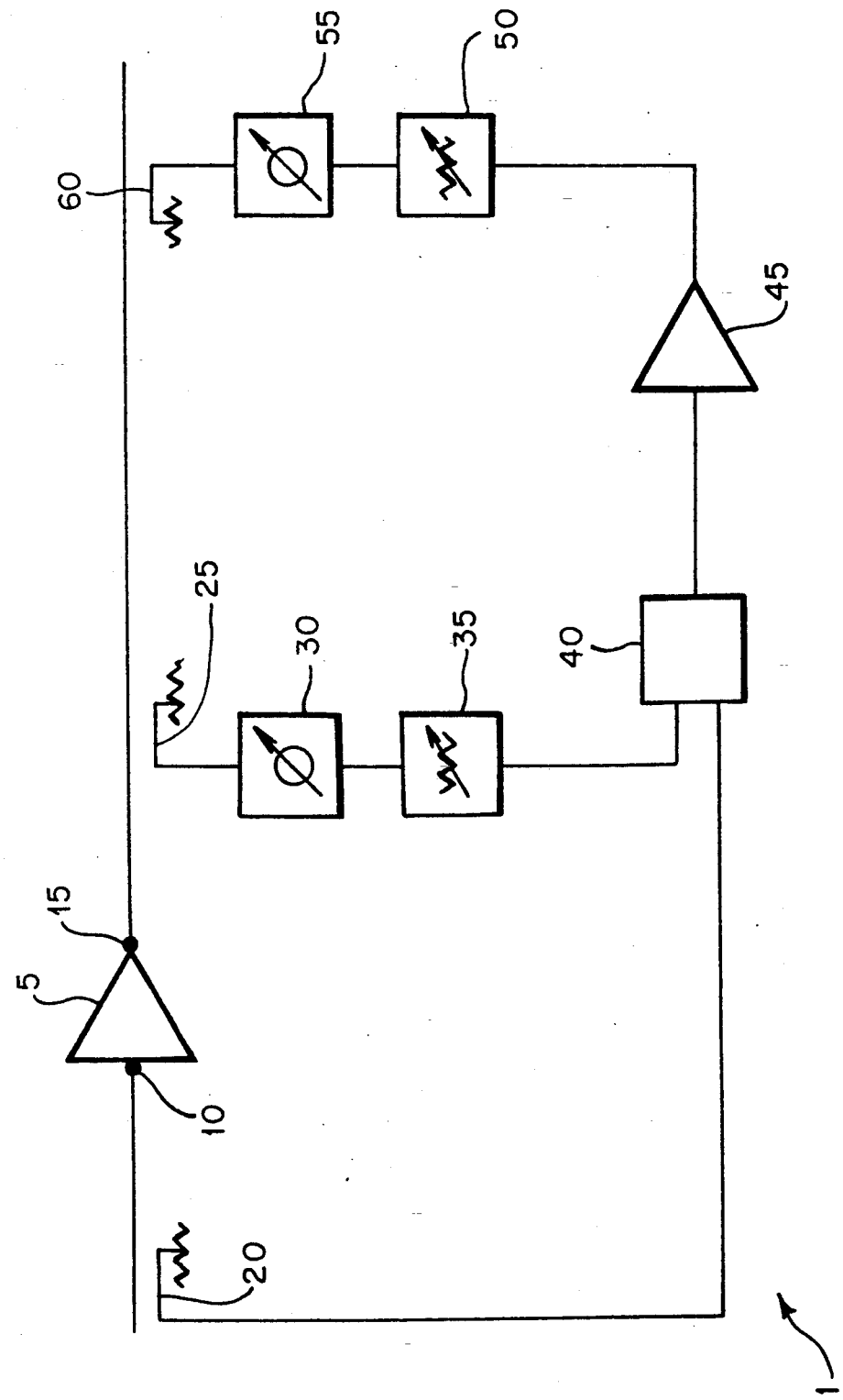
FIG. 1 is a functional block diagram of a conventional feed-forward system.

Referring now to the drawings, FIG. 2 illustrates one form of the adaptive feed-forward apparatus for amplifier noise reduction of the present invention. The adaptive feed-forward apparatus 100 is adapted to be connected to a power or other type of amplifier 105. The power amplifier receives an input signal for amplification and provides a power amplifier output signal which consists of the amplified input signal component and, as is known to happen, amplifier noise and distortion added to amplified the input signal due to the operation of the power amplifier.

The adaptive feed-forward apparatus 100 includes a first directional coupler 110 electrically coupled to the input of the amplifier 105. The first directional coupler receives an input signal and provides the input signal to the amplifier input. In addition, the directional coupler provides the input signal as a reference signal to the reference input 115 of an interference canceller 120. Electrically coupled to the amplifier output is a second directional coupler 125 which receives the amplifier output signal and provides a sample signal on one of its outputs corresponding to the amplifier output signal.

The sample signal is provided to a third directional coupler 130 which is electrically connected to the output of the second directional coupler 125 by transmission line 132. The sample signal is provided to a sample input 135 of the interference canceller 120 by the third directional coupler.

The interference canceller 120 compares the reference signal and the sample signal and essentially detects the signal components of the sample signal that are coherent with the reference signal. The interference canceller adjusts the amplitude and phase of the reference signal and provides a cancellation signal corresponding to the coherent signal component. The cancellation signal is provided on the output 140 of the interference canceller. The cancellation signal, when injected onto transmission line 132, essentially has the same amplitude as the coherent signal component but is manipulated so that it is 180° out of phase with the input signal component of the sample signal.

Electrically coupled to the interference canceller output 140 is a fourth directional coupler 145. The fourth directional coupler is also electrically coupled to the second directional coupler 125 and the third directional coupler 130 by transmission line 132. The cancellation signal, which corresponds to the coherent signal component, is injected by the fourth directional coupler onto the transmission line 132 which carries the sample signal provided by the second directional coupler. By injecting the cancellation signal, which is 180° out of phase as compared to the sample signal, onto the transmission line 132, the signal component of the sample signal which is equal in magnitude and opposite in phase with the cancellation signal will be eliminated. The resultant signal remaining on the transmission line is essentially an error signal representing the noise and distortion component added to the amplified input signal by the amplifier 105.

In a preferred embodiment, an error amplifier 150 is electrically coupled to the third directional coupler 130 and the fourth directional coupler 175. In general the error amplifier, which is preferably a linear low noise amplifier because of the small amplitude of the error signal as compared to the input signal, may be used to amplify the error signal so that it has substantially the same amplitude as the signal noise and distortion component of the amplifier output signal. Additionally, the error amplifier serves to alter the phase of the error signal by 180°. Error amplifiers can also be placed at various circuit locations in order to amplify corresponding signals and compensate for losses in signal strength throughout the circuit.

The preferred embodiment may also include a phase trimmer 155 and an amplitude trimmer 160 which may be connected in series to each other and to the output of the error amplifier 150. The phase and amplitude trimmers are utilized for adjusting the error amplifier output signal so as to insure that after injection by a fifth directional coupler, the error signal has substantially the same amplitude and is substantially 180° out of phase with the noise and distortion component added by the amplifier.

Operatively coupled to the amplitude and phase trimmers 155, 160 is the fifth directional coupler 165. The fifth directional coupler is also electrically coupled to the transmission line 170 which carries the amplifier output signal. The fifth directional coupler is utilized to inject the phase and amplitude adjusted error amplifier signal onto the transmission line 170 which carries the amplifier output signal. This process serves to cancel the noise and distortion component added by the amplifier 105 during amplification of the input signal. As a result, the output signal which is provided on the transmission line 170 substantially consists of the input signal amplified by the amplifier without the additional unwanted noise and distortion component which was previously added by the amplifier.

Alternatively, the directional couplers 145, 165 which are utilized to inject the cancellation and error amplifier signals onto transmission lines 132, 170 can be subtraction couplers instead of addition couplers. Therefore, the cancellation signal and the amplitude and phase adjusted error amplifier signal would not have to be 180° out of phase with their respective comparative signals before being provided to the directional couplers 145, 165. The subtraction couplers would automatically subtract the cancellation signal or error amplifier signal from the signal being carried on the respective transmission lines 132, 170. Furthermore, the second directional coupler 125 may also sample the amplifier output signal with or without changing the phase of the sample signal by 180° and the signal inversion can be accomplished by any of the circuit components as needed.

The interference canceller 120 basically includes a synchronous detector 175, which has at least two input ports that are respectively electrically coupled to the outputs of the first directional coupler 110 through directional coupler 190 and the second directional coupler 125 so that the reference signal and sample signal are provided to the synchronous detector. The synchronous detector is basically a quadrature phase detector. A typical synchronous detector which is suitable for use is described in U.S. Pat. No. 3,999,444, which issued to Rabindra Ghose and Walter Sauter, the disclosure of which is incorporated herein by reference. The synchronous detector compares the reference signal and the sample signal and provides one or more detector output signals.

The interference canceller may also include an amplifier and/or an integrator 180 which is connected to the output of the synchronous detector 175 so that the DC output signals of the detector will be amplified and integrated to create control signals, which signals are provided to a signal controller 185 of the interference canceller 120.

A signal controller 185, also known as a vector modulator, which is suitable for use in the interference canceller 120 of the present invention is described in U.S. Pat. No. 3,699,444, mentioned previously. In its simplest form, the signal controller may consist of an in-phase and a quadrature-phase electronic attenuator, each being controllable by a respective DC control signal. One of its inputs is provided with a portion of the reference signal from the output of the first directional coupler 110. Another input of the signal controller receives the control signals from the amplifiers/integrators 180. An output of the signal controller is provided to the fourth directional coupler 145, or 180° hybrid, which is coupled to the transmission line 132.

The signal controller 185 provides a cancellation signal to the fourth directional coupler which, in effect, injects the cancellation signal onto the transmission line 132 carrying the noise and distortion signals.

An example of an interference canceller 120 which may be used in the present invention is specifically set forth and described in co-pending applications: "Interference Cancellation System For Interference Signals Having An Arbitrary And Unknown Duration And Direction", filed Dec. 29, 1989, Ser. No. 07/458,901; "Highly Directive Radio Receiver Employing Relatively Small Antennas", filed Dec. 29, 1989, Ser. No. 07/458,842; and "Interference Cancellation System Having Noise Reduction Features And Method", filed Feb. 22, 1990, Ser. No. 07/483,543, the inventor of each of which is Ashok K. Talwar, and in the publication "Antenna Spacing Consideration In An Interference Canceller", by Ashok K. Talwar, published in IEEE Transactions on Broadcasting, Vol. 36, No. 3, pp. 203-06, Sep. 1990. The disclosure of each of these references is incorporated herein by reference.

Referring now to FIG. 3, an alternative embodiment of the adaptive feed-forward apparatus for amplifier noise reduction will now be described. A second interference canceller 200 may be utilized to replace the phase and amplitude trimmers 155, 160 of FIG. 2 which were implemented for adjusting the amplified error signal. The reference input 210 of the second interference canceller is electrically coupled to the error amplifier 150 previously described with respect to the embodiment of FIG. 2. The reference input 210 receives the amplified error signal as a second reference signal. In this embodiment, the phase of the error signal is not altered by the error amplifier 150 although it may be altered. The sample input 240 of the second interference canceller is electrically coupled to a sixth directional coupler 230 which is coupled to the transmission line 170 which carries the amplifier output signal. The sample input 240 receives the amplifier output signal as a second sample signal. The fifth directional coupler 165 is coupled to the interference canceller output 220, to a second error amplifier 250 and also to the transmission line 170 which carries the amplifier output signal. The remainder of the circuit is the same as that described previously with respect to the embodiment shown in FIG. 2.

The second interference canceller 200 will essentially generate a second cancellation signal which corresponds to the portion of the second sample signal which is coherent to the second reference signal. Since the second reference signal corresponds to the noise and distortion component of the output signal of amplifier 105, and since the amplifier output signal is provided to the second interference canceller as a sample signal, the second interference canceller 200 will provide the noise and distortion component as a cancellation signal because the noise and distortion component is common to both signals. The cancellation signal provided by the second interference canceller 200 will have the characteristic of being substantially 180° out of phase with the sample signal. In a preferred embodiment, the cancellation signal will be provided to a second linear, low noise error amplifier 250. The second linear low noise error amplifier is used to amplify the second cancellation signal so that this signal has substantially the same magnitude as the signal noise and distortion component of the output signal of amplifier 105 when it is injected onto transmission line 170 by directional coupler 165.

The output of the second linear, low noise error amplifier 250 is provided to the fifth directional coupler 165. As previously described, the fifth directional coupler is electrically coupled to the electrical line 170 which carries the amplifier output signal. The fifth directional coupler is used to inject the second cancellation signal, essentially consisting of a signal which is equal in magnitude and 180° out of phase with the noise and distortion component of the amplifier output signal, onto the transmission line 170 carrying the amplifier output signal. This process will cancel the noise and distortion component added by the amplifier during amplification of the input signal. In this way, the output signal consists of only the input signal amplified by the amplifier and it is essentially free of the unwanted noise and distortion component added by the amplifier.

Alternatively, the second interference canceller 200 will provide a cancellation signal which is in phase with the noise and distortion component of the amplifier output signal. Therefore, either the error amplifier 250 or the directional coupler 165 will be employed to change the phase of the second cancellation signal before it is combined with the amplifier output signal on transmission line 170.

The operation of the adaptive feed-forward apparatus in accordance with the present invention will now be described by reference to FIG. 2. As previously described, the adaptive feed-forward apparatus includes interference canceller 120. As an input signal is provided to the system, the amplifier 105 receives the input signal, amplifies it and provides an amplifier output signal. The input signal and amplifier output signal are respectively sampled utilizing the first directional coupler 110 and the second directional coupler 125. The input signal and amplifier output signal are respectively provided to the reference input 115 and sample input 135 of the interference canceller 120. The third directional coupler 130 provides the sample output signal to the sample input 135 of the interference canceller. The reference signal and the sample signal are compared by the interference canceller so that a cancellation signal is provided. The cancellation signal is essentially the signal component which is common to both the input signal and the sample signal. In this scenario, the cancellation signal is essentially the input signal. However, the cancellation signal will be substantially 180° out of phase with the sample signal so that when directional coupler 145 injects the cancellation signal onto transmission line 132, components of the sample signal which are equal in amplitude and opposite in phase with cancellation signal will be eliminated. The remaining signal, called the error signal, represents the noise and distortion component which was added to the input signal by the amplifier.

The error signal is provided to the error amplifier 150. In the preferred embodiment, the error amplifier is a linear, low noise amplifier so that additional distortion is not introduced to the error signal. The error amplifier processes the error signal so that when the error signal is injected onto transmission line 170, the error signal will have substantially the same magnitude as the noise and distortion component provided by the amplifier 105. In addition, the error amplifier will alter the phase of the error signal so that it is 180° out of phase with the noise and distortion component of the output signal from amplifier 105. The error amplifier output signal is then adjusted in amplitude and phase by the amplitude trimmer 155 and phase trimmer 160 to insure that when the error signal is injected onto transmission line 170, it is equal in amplitude and 180° out of phase as compared to the noise and distortion component of the amplifier output signal. The fifth directional coupler 165 receives the amplitude and phase altered error signal and injects this signal onto transmission line 170 so that the noise and distortion component of the output signal can be canceled. As a result, the output signal which remains is only the input signal amplified by the amplifier without the unwanted noise and distortion components.

When as shown in FIG. 3, a second interference canceller 200 is used in place of the amplitude and phase trimmers, the error signal is provided to the reference input 210 of the second interference canceller. The sixth directional coupler 230 samples the amplifier output signal from transmission line 170 and provides this signal to the sample input 240 of the second interference canceller as the second reference signal. As described with regard to the first interference canceller, the second interference canceller will compare the second reference signal and second sample signal in order to provide a second cancellation signal which is substantially equal to the signal components which are common to both of the above-mentioned signals. Since the noise and distortion component is common to both the reference and sample signals, the cancellation signal substantially corresponds to the noise and distortion added to the input signal.

The second interference canceller generates the second cancellation signal to be 180° out of phase with the sample signal. The second cancellation signal is provided by the output 220 of the interference canceller 200 to the second error amplifier 250. The second error amplifier alters the cancellation signal so that it has substantially the same amplitude as the output signal of amplifier 105 when the signal is injected by directional coupler 165. Since the cancellation signal provided by the second interference canceller is 180° out of phase with the amplifier output signal, a phase change is not required to be performed by the second error amplifier. The second error amplifier output signal is provided to the fifth directional coupler 165 which injects the second error amplifier output signal onto the transmission line 170 so that the noise and distortion component added by the amplifier can be removed from the amplifier output signal.

When using the above-identified apparatus, some important considerations in the design of such a feed-forward network should be considered. First, with regard to a single interference canceller, the delay provided between directional coupler 125 and directional coupler 165 as compared to the delay provided by the loop between coupler 125, error amplifier 150 and directional coupler 165 should be substantially equal so that the signals can maintain a proper phase relationship. Attention should be given to the dispersion characteristics of the two routes. Secondly, the error amplifiers should be of a linear variety. Otherwise, the error amplifier may introduce additional distortion to the already distorted signal thereby affecting the cancellation of the distorted portion of the signal. Thirdly, matching of the amplitude and phase in the two above-identified branches of the second half of the circuit are important and therefore the gain and phase flatness of the error amplifiers should be considered.

It is within the scope of the present invention that more than one signal can be provided as input signals to the amplifier 105 and sampled by directional couplers 110, 125. These input signals can be separately processed by the separate interference cancellers corresponding to each input signal.

As a result of the present invention, environmental changes and aging of components which cause a degraded performance of conventional, manually adjusted systems will not degrade the performance of the adaptive interference canceller of the present invention because the canceller will correct for changes caused by the environment and aging in order to maintain optimum cancellation. Furthermore, since the power amplifier 105 is generally a non-linear element, changes in gain and phase can easily invalidate adjustments made to a feed-forward system. However, the adaptive interference canceller eliminates this problem by automatically adjusting the phase and amplitude to maintain substantially full cancellation. Thirdly, when the adaptive interference canceller of the present invention is used, the cancellation bandwidth need only be equal to the bandwidth of the input signal since the maximum cancellation in an adaptive loop occurs at the frequency of maximum signal power. When utilizing the non-adaptive conventional system, the bandwidth must be set to the full band of interest, since the input signal can appear anywhere within the band. Thus, improved cancellation of the input signal is achieved with the adaptive interference canceller of the present invention.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed:

1. An adaptive feed-forward network for connection to an amplifier and for reducing noise and distortion generated by the amplifier, the amplifier having an input on which is provided a substantially distortion free input signal and an output on which is generated by the amplifier an output signal comprising an amplified input signal component and a noise and distortion component, the adaptive feed-forward network comprising:

a first directional coupler, the input signal being provided to the first directional coupler, the first directional coupler having an output and generating thereon a reference signal corresponding to the input signal;

a second directional coupler, the amplifier output signal being provided to the second directional coupler, the second directional coupler having an output and generating thereon a sample signal having an amplified input signal component and a noise and distortion component corresponding to the amplifier output signal;

a third directional coupler, the sample signal being provided to the third directional coupler, the third directional coupler having an input and an output;

a fourth directional coupler, the fourth directional coupler being electrically coupled to the output of the third directional coupler, the fourth directional coupler having an output on which is provided a portion of the sample signal;

an interference canceller, the interference canceller having a reference input and a sample input, the reference input receiving the reference signal from the first directional coupler and the sample input receiving the sample signal from the third directional coupler, the interference canceller further having an output and generating thereon a cancellation signal, the cancellation signal being substantially equal to and opposite in phase to the input signal component of the sample signal, the cancellation signal being provided to the input of the fourth directional coupler, the fourth directional coupler effectively combining the sample signal with the cancellation signal so as to eliminate substantially the input signal component from the sample signal thereby providing an error signal substantially consisting of only the noise and distortion component of the sample signal; and a fifth directional coupler, the fifth directional coupler being electrically coupled to the output of the fourth directional coupler and to the amplifier output, the error signal and the amplifier output signal being provided to the fifth directional coupler, the fifth directional coupler effectively subtracting the error signal from the amplifier output signal thereby leaving substantially only the amplified input signal component remaining in the amplifier output signal.

2. An adaptive feed-forward network for connection to an amplifier for reducing noise and distortion generated by the amplifier as defined by claim 1 further comprising:

an error amplifier being coupled between the fourth directional coupler and the fifth directional coupler, the error amplifier amplifying the error signal so that the error signal has substantially the same magnitude as the signal noise and distortion components of the amplifier output signal, the error amplifier providing an amplified error signal to the fifth directional coupler.

3. An adaptive feed-forward network for connection to an amplifier for reducing noise and distortion generated by the amplifier as defined by claim 1 further comprising:

phase adjustment means being coupled between the fourth directional coupler and the fifth directional coupler, the phase adjustment means receiving and modifying the phase of the error signal so that the error signal is substantially out of phase with the signal noise and distortion component of the amplifier output signal, the phase adjustment means providing a phase modified error signal to the fifth directional coupler.

4. An adaptive feed-forward network for connection to an amplifier for reducing noise and distortion generated by the amplifier as defined by claim 1 further comprising:

amplitude adjustment means being coupled between the fourth directional coupler and the fifth directional coupler, the amplitude adjustment means receiving and modifying the amplitude of the error signal so that the error signal has substantially the same amplitude as the signal noise and distortion component of the amplifier output signal, the amplitude adjustment means providing an amplitude modified error signal to the fifth directional coupler.

5. An adaptive feed-forward network for connection to an amplifier and for reducing noise and distortion generated by the amplifier, the amplifier having an input on which is provided a substantially distortion free input signal and an output on which is generated by the amplifier an output signal comprising a signal component and a noise and distortion component, the adaptive feed-forward network comprising;

a first directional coupler, the input signal being provided to the first directional coupler, the first directional coupler having an output and generating thereon a reference signal corresponding to the input signal;

a second directional coupler, the amplifier output signal being provided to the second directional coupler, the second directional coupler having an output and generating thereon a sample signal having an amplified input signal component and a noise and distortion component corresponding to the amplifier output signal;

a third directional coupler, the sample signal being provided to the third directional coupler, the third directional coupler having an input and an output;

a fourth directional coupler, the fourth directional coupler being electrically coupled to the output of the third directional coupler, the fourth directional coupler having an output on which is provided a portion of the sample signal;

a first interference canceller, the first interference canceller having a first reference input and a first sample input, the first reference input receiving the reference signal from the first directional coupler and the sample input receiving the sample signal from the third directional coupler, the first interference canceller further having a first output and generating thereon a first cancellation signal, the first cancellation signal being substantially equal to and opposite in phase to the input signal component of the sample signal, the first cancellation signal being provided to the input of the fourth directional coupler, the fourth directional coupler effectively combining the sample signal with the cancellation signal so as to eliminate substantially the input signal component from the sample signal thereby providing a first error signal substantially consisting of only the noise and distortion component of the sample signal;

a fifth directional coupler, the sample signal being provided to the fifth directional coupler, the fifth directional coupler having an input and an output;

a sixth directional coupler, the sixth directional coupler being electrically coupled to the output of the fifth directional coupler, the sixth directional coupler having an output on which is provided a portion of the sample signal; and a second interference canceller, the second interference canceller having a second reference input and a second sample input, the second reference input receiving the first error signal from the fourth directional coupler as a second reference signal, the second interference canceller further having a second output and generating thereon a second cancellation signal, the second cancellation signal being substantially equal to and opposite in phase to the reference signal component of the sample signal, the second cancellation signal substantially consisting of only the noise and distortion component of the sample signal being provided to the input of the sixth directional coupler, the sixth directional coupler effectively combining the amplifier output signal with the second cancellation signal so as to effectively subtract the second cancellation signal from the amplifier output signal thereby leaving substantially only the amplified input signal component remaining in the amplifier output signal.

6. An adaptive feed-forward network for connection to an amplifier for reducing noise and distortion generated by the amplifier as defined by claim 5 further comprising:

an error amplifier being coupled between the fourth directional coupler and the reference input of the second interference canceller, the error amplifier receiving and amplifying the first altered sample signal so that the first altered sample signal has substantially the same magnitude as the signal noise and distortion component of the amplifier output signal, the error amplifier providing an amplified first altered sample signal to the reference input of the second interference canceller.

7. An adaptive feed-forward network for connection to an amplifier for reducing noise and distortion generated by the amplifier as defined by claim 5 further comprising:

an error amplifier being coupled between the output of the second interference canceller and the sixth directional coupler, the error amplifier receiving and amplifying the second cancellation signal so that the second cancellation signal has substantially the same magnitude as the signal noise and signal distortion component of the amplifier output signal, the error amplifier providing an amplified second cancellation signal to the sixth directional coupler.

8. A method for removing a noise and distortion signal component generated by an amplifier from an amplifier output signal, the amplifier having an input and an output, the method comprising:

sampling an undistorted input signal, which is provided to an input of the amplifier, with a first directional coupler; providing the undistorted input signal as a reference signal to an interference canceller;

sampling an amplifier output signal which is provided on an output of the amplifier with a second directional coupler to generate a sample amplifier output signal, the amplifier output signal including a substantially undistorted amplified input signal component and a noise and distortion component;

providing the sample amplifier output signal as a sample signal to a third directional coupler which provides the sample signal to the interference canceller;

comparing the reference signal and the sample signal and generating a cancellation signal which is substantially equal to and opposite in phase to the amplified input signal component of the sample signal;

providing the cancellation signal to a fourth directional coupler for injecting the cancellation signal onto a transmission line which carries the sample signal so as to provide an error signal which is substantially equal to the noise and distortion component of the amplifier output signal; and providing the error signal to a fifth directional coupler for injecting the error signal onto a transmission line which carries the amplifier output signal so as to effectively subtract the error signal from the amplifier output signal thereby leaving substantially only the amplified input signal component remaining in the amplifier output signal.

* * * * *